United States Patent
Fink et al.

(10) Patent No.: US 10,670,433 B2
(45) Date of Patent: Jun. 2, 2020

(54) HOUSING FOR A FIELD DEVICE

(71) Applicant: Endress + Hauser Flowtec AG, Reinach (CH)

(72) Inventors: Nikolai Fink, Aesch (CH); Thierry Moser, Sierentz (FR); Bjorn Larsson, Birsfelden (CH)

(73) Assignee: ENDRESS + HAUSER FLOWTEC AG, Reinach (CH)

( * ) Notice: Subject to any disclaimer, the term of this patent is extended or adjusted under 35 U.S.C. 154(b) by 126 days.

(21) Appl. No.: 15/779,628

(22) PCT Filed: Dec. 1, 2016

(86) PCT No.: PCT/EP2016/079471
§ 371 (c)(1),
(2) Date: May 29, 2018

(87) PCT Pub. No.: WO2017/108367
PCT Pub. Date: Jun. 29, 2017

(65) Prior Publication Data
US 2018/0348020 A1  Dec. 6, 2018

(30) Foreign Application Priority Data
Dec. 21, 2015  (DE) .................. 10 2015 122 468

(51) Int. Cl.
*G01D 11/24* (2006.01)
*H05K 5/06* (2006.01)
(Continued)

(52) U.S. Cl.
CPC ........... *G01D 11/245* (2013.01); *G01D 11/24* (2013.01); *H02K 5/136* (2013.01); *H05K 5/0247* (2013.01);
(Continued)

(58) Field of Classification Search
CPC .... G01D 11/245; G01D 11/24; H02K 5/0247; H05K 5/064; H05K 5/136; H05K 5/069; H05K 7/1462
(Continued)

(56) References Cited

U.S. PATENT DOCUMENTS

| 2013/0247660 A1 | 9/2013 | Matt | |
| 2014/0027172 A1* | 1/2014 | Schillinger | H05K 5/0056 174/521 |

FOREIGN PATENT DOCUMENTS

| CN | 10 79548 A | 12/1993 |
| CN | 2 03251537 U | 10/2013 |

(Continued)

OTHER PUBLICATIONS

Enlish translation of WO2011079896 specification. provided by wipo patentscope. accessed Nov. 26, 2019.*
(Continued)

*Primary Examiner* — Nimeshkumar D Patel
*Assistant Examiner* — Jean F Morello
(74) *Attorney, Agent, or Firm* — Bacon & Thomas, PLLC

(57) ABSTRACT

A housing of a field device of measuring- and automation technology, comprising a housing body, which has at least two housing chambers, wherein the housing chambers are connected together by an opening. The opening is adapted to accommodate a circuit board which is held by at least one holder, wherein the circuit board is adapted to be populated with electronic components or assemblies. The opening is Ex-d sealed with a potting compound.

9 Claims, 3 Drawing Sheets

(51) Int. Cl.
  *H05K 7/14* (2006.01)
  *H02K 5/136* (2006.01)
  *H05K 5/02* (2006.01)
  *H02G 3/08* (2006.01)
(52) U.S. Cl.
  CPC ............ *H05K 5/064* (2013.01); *H05K 5/069* (2013.01); *H05K 7/1462* (2013.01); *H02G 3/088* (2013.01)
(58) Field of Classification Search
  USPC .......................................................... 73/431
  See application file for complete search history.

(56) References Cited

FOREIGN PATENT DOCUMENTS

| DE | 203 14 618 U1 | 12/2003 | | |
|---|---|---|---|---|
| DE | 10 2012 005 637 A1 | 9/2013 | | |
| DE | 10 2012 005 638 A1 | 9/2013 | | |
| DE | 10 2015 122 468 A1 | 6/2017 | | |
| EP | 1 858 312 A2 | 11/2007 | | |
| EP | 2 642 255 A2 | 9/2013 | | |
| WO | 98/57186 A2 | 12/1998 | | |
| WO | WO-2007065445 A2 | * | 6/2007 | ............. H05K 3/284 |
| WO | WO-2011079896 A1 | * | 7/2011 | ........... G01D 11/245 |
| WO | 2011/134770 A2 | 11/2011 | | |
| WO | 2013/188141 A1 | 12/2013 | | |

OTHER PUBLICATIONS

German Search Report, German PTO, Munich, dated Nov. 3, 2016.
International Search Report, EPO, The Netherlands, dated Feb. 8, 2017.
Office Action dated Sep. 30, 2019 in corresponding Chinese application No. 201680075066.4.

* cited by examiner

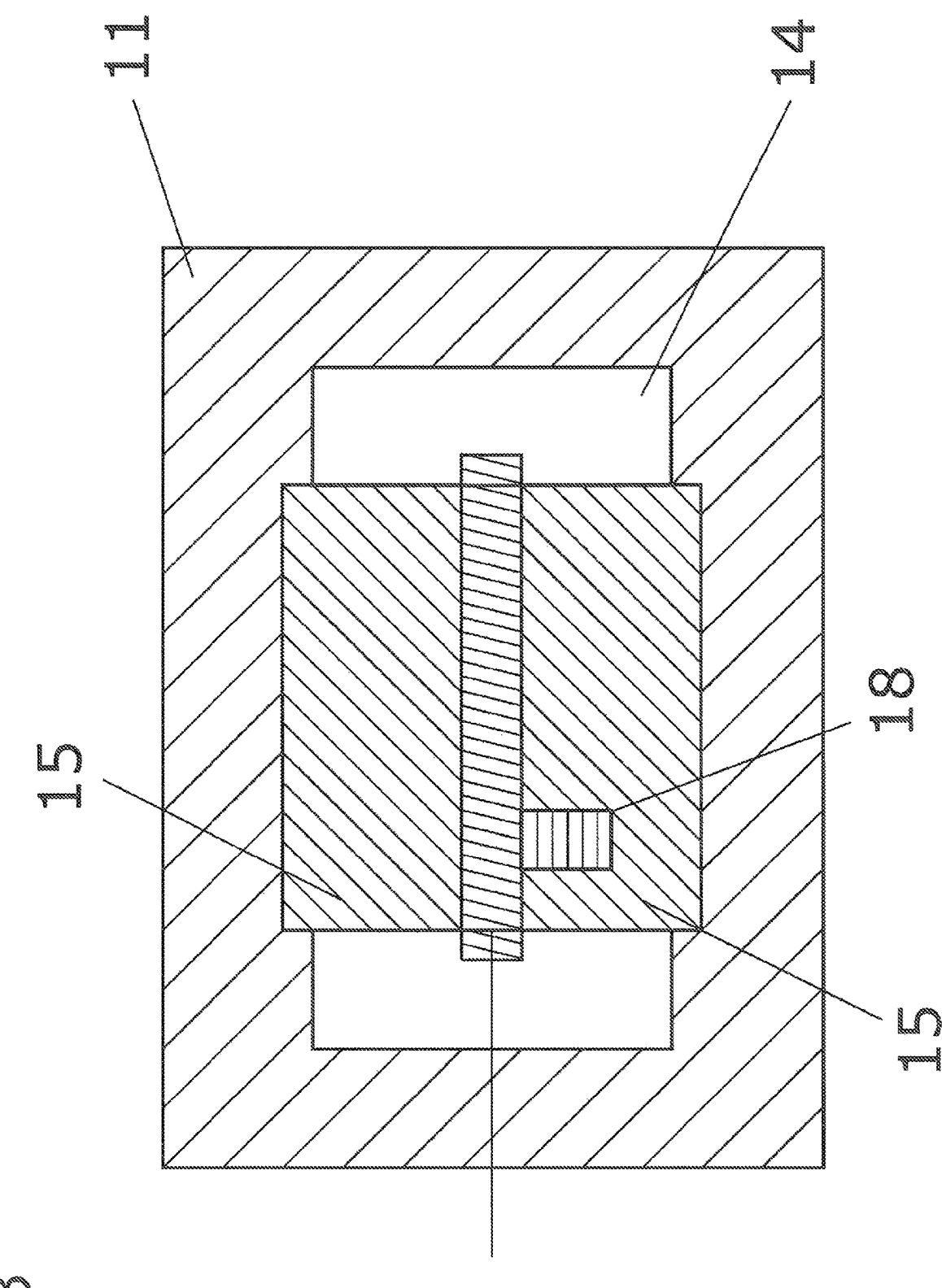

HOUSING FOR A FIELD DEVICE

TECHNICAL FIELD

The invention relates to a housing of a field device of measuring- and automation technology, wherein the housing has a housing body with at least two housing chambers, and wherein the housing can be used in explosion-endangered regions.

BACKGROUND DISCUSSION

Field devices are sometimes applied in environments, in which combustible gases can be located. Such gases can, especially when they surround a field device over a long period of time, penetrate into the housing of the field device. Combustible gases in contact with electronic components represent a safety hazard, since sparks released by electronic components are difficult to prevent. Housings of field devices are frequently divided into multiple chambers, wherein electronic components or assemblies are distributed to these chambers. Electronic assemblies of different chambers must, however, frequently communicate with one another, so that electrical signals must be exchanged between the different chambers. Therefore, openings must be provided in the walls of the housing chambers for feedthrough of electrical signals, this meaning thus that an explosion in one chamber can, in principle, reach into another chamber. The state of the art meets this problem with, among others, cable glands or potted cable harnesses, which enable connection of the electronic components between the chambers. Both solutions have the disadvantage that the number of lines and the connections possible therewith are limited. A better solution in this regard is to use potted circuit boards, since circuit boards can have a large number of electrical connections. Moreover, a circuit board can be so populated that a first part of the electronics is in a first housing chamber and a second part in a second housing chamber. The state of the art, as shown by the documents, German Patents, DE102012005637A1 and DE102012005638B4, leads contacting elements through openings, in order to pot them thereafter. Furthermore, the contacting element of DE102012005637A1 can be plug shaped. In this way, in the case of an explosion, the explosion pressure would act at least in one direction to press the contacting element into the potting compound, such that it remains in its provided position. In this way, the contacting element is, however, only pressure bearing in one direction, whereby for the other housing chamber another protection type is necessary for preventing explosions. The setup of different protection types is, however, associated with increased effort.

SUMMARY OF THE INVENTION

An object of the present invention is, consequently, to provide a housing for a field device, in which the safety of the field device is fulfilled by a fulfillment of the Ex-d-standard independently in both housing chambers, and wherein an electrical connection is produced between the housing chambers by means of a fedthrough circuit board.

The object of the invention is achieved by an apparatus including a housing for a field device of measuring- and automation technology, comprising: at least one housing body having at least two housing chambers; and at least one wall said housing chambers are separated by said wall, which wall has at least one opening, which opening connects said housing chambers together; and at least one circuit board, wherein: in that said opening is adapted to accommodate said at least one circuit board, which circuit board extends through said opening; and said at least one circuit board is held by at least one holder said opening is sealed by a potting compound, said potting compound assures an Ex-d seal according to the standard IEC 600079-1.

The housing of the invention for a field device of measuring- and automation technology includes at least one housing body having at least two housing chambers; and at least one wall, wherein the housing chambers are separated by the wall, which wall has at least one opening, which opening connects the housing chambers together, wherein the opening is adapted to accommodate at least one circuit board, which circuit board extends through the opening, wherein the circuit board is held by at least one holder, wherein the opening is sealed by a potting compound, wherein the potting compound assures an Ex-d seal according to the standard IEC 600079-1 of year 2014. In an embodiment of the housing, relative movement of the circuit board relative to the housing body is blocked.

In an embodiment of the housing, the at least one holder is affixed to the circuit board and/or to the housing. The affixing can be accomplished by adhesive or by screw means. Furthermore, the affixing of the holder can be performed before or after insertion of the circuit board into the opening. In an embodiment of the housing, the circuit board is held by at least two holders, wherein the circuit board is held at a first and had an oppositely lying, second board area of the circuit board, in each case, by at least one holder.

In an embodiment of the housing, at least one of the holders belonging to the first board area is arranged lying opposite to a holder belonging to the second board area. In this way, it is especially prevented that bending forces act on the circuit board, since holders are located on both sides of the circuit board. In an embodiment of the housing, the wall forms a stop for at least one holder relative to a movement of the circuit board with the holder in the direction of the normal of the opening. In the case of a deflection of the circuit board by an explosion in a housing chamber, the holder can bear against the stop and so protect the potting compound in the case of accommodating the explosive pressure.

In an embodiment of the housing, the wall forms a stop for at least one holder of the first board area and at least one holder of the second board area relative to a movement of the circuit board with the holders in the direction of the normal of the opening. In the case of a deflection of the circuit board by an explosion in a housing chamber, the holders can bear against the stop and so protect the potting compound in the case of accommodating the explosive pressure.

In an embodiment of the housing, the holder is at least partially surrounded by the potting compound. The covering of the holder by the potting compound must assure that the contact of the holder with the potting compound can absorb the forces caused by an explosion.

In an embodiment of the housing, the opening is adapted to accommodate a populated circuit board section extending through the opening. In this way, electronic components or electromechanical connecting elements can be arranged in both housing chambers on the circuit board. The ability to populate the circuit board before introduction of the circuit board into the opening simplifies the assembly of the field device.

In an embodiment of the housing, the opening is adapted to accommodate an unpopulated circuit board section extending through the opening.

BRIEF DESCRIPTION OF THE DRAWINGS

The apparatus of the invention will now be explained based on examples of embodiments presented in the appended drawing, the figures of which show as follows:

FIG. 3 is a plan view of the cross section shown in FIG. 2 from the direction B defined in FIG. 2.

DETAILED DISCUSSION IN CONJUNCTION WITH THE DRAWINGS

Figure 1:
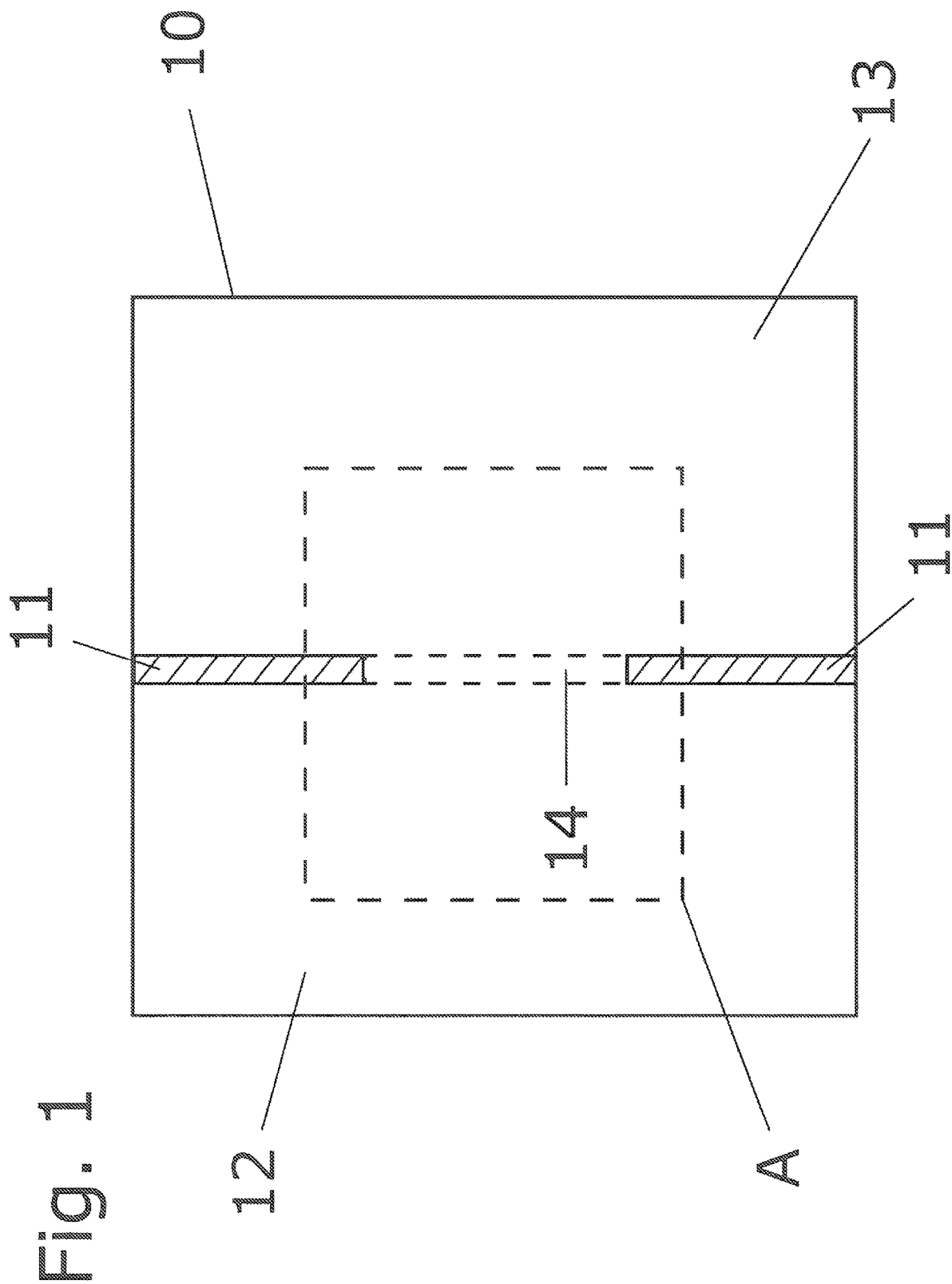
FIG. 1 is by way of example, a cross section through a housing body.

FIG. 1 shows a cross section through a housing body 10 having a wall 11, a first housing chamber 12, a second housing chamber 13 and an opening 14 in the wall 11, which connects the two housing chambers 12, 13 together. The region A with the opening 14 is shown more exactly in FIG. 2 with a circuit board 16.

Figure 2:
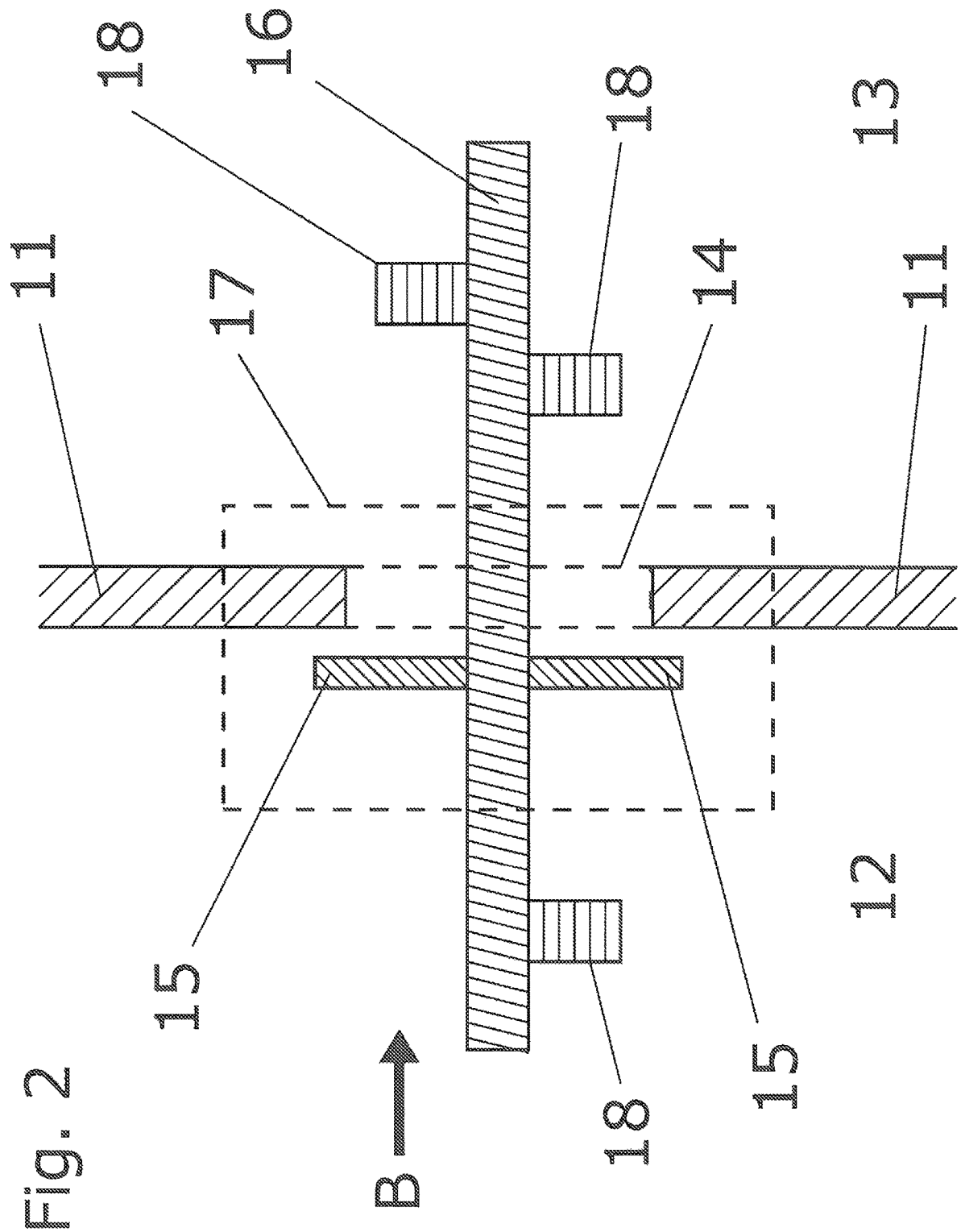
FIG. 2 is by way of example, a cross section through a wall with opening of the housing body, wherein the opening contains, furthermore, a circuit board populated with electronic components.

FIG. 2 shows the region A, which includes the opening 14 with a circuit board 16. Mounted on the circuit board are two holders 15. The circuit board can be populated with electronic components 18. The potting compound is usually applied within a region 17, wherein it must be assured that the opening 14 is sealed according to the requirements of the pressure resistant encapsulation. The potting compound surrounds the holders 15 partially or completely. It must be assured that the holders 15 can completely absorb compressive forces of an explosion via the contact area, potting compound-holder. The holders are, in such case, covered at least 60% and preferably at least 75% and especially at least 90% by the potting compound. The direction B gives the direction of the plan view in FIG. 3 and the insertion direction of the circuit board into the opening. The holders can be mounted, in such case, before or after insertion of the circuit board 16 into place. The holders can further be so dimensioned that they are stopped by the wall 11 in the case of movement in the direction B through the opening 17.

FIG. 3 shows a plan view of the cross section shown in FIG. 2, wherein the wall 11 has the opening 14, which has accommodated circuit board 16 populated with electronic components 18.

The invention claimed is:

1. A housing for a field device of measuring- and automation technology, comprising:

at least one housing body having at least two housing chambers; and at least one wall said housing chambers are separated by said wall, which wall has at least one opening, which opening connects said housing chambers together; and at least one circuit board, wherein:

in that said opening is adapted to accommodate said at least one circuit board, which circuit board extends through said opening; and said at least one circuit board is held by at least one holder said opening is sealed by a potting compound, said potting compound assures an Ex-d seal according to the standard IEC 600079-1;

wherein said holder is at least partially surrounded by said potting compound.

2. The housing as claimed in claim 1, wherein:

relative movement of said at least one circuit board relative to said at least one housing body is blocked by means of said potting compound.

3. The housing as claimed in claim 1, wherein:

said at least one holder is affixed to said at least one circuit board and/or to said at least one housing body and/or to said wall.

4. The housing as claimed in claim 1, wherein:

said at least one circuit board is held by at least two holders; and said at least one circuit board is held at a first and at a second board area of said at least one circuit board, in each case, by said at least one holder.

5. The housing as claimed in claim 4, wherein:

said at least one of said holders belonging to said first board area is arranged lying opposite to a holder belonging to said second board area.

6. The housing as claimed in claim 1, wherein:

said wall forms a stop for at least one holder relative to a movement of said at least one circuit board with said holder in the direction of the normal of said opening.

7. The housing as claimed in claim 4, wherein:

said wall forms a stop for at least one holder of said first board area and at least one holder of said second board area relative to a movement of said at least one circuit board with the holders in the direction of the normal of said opening.

8. The housing as claimed in claim 1, wherein:

said opening is adapted to accommodate a circuit board section populated with electronic components or assemblies, which circuit board section extends through said opening.

9. The housing as claimed in claim 1, wherein:

said opening is adapted to accommodate an unpopulated circuit board section extending through said opening.

* * * * *